(12) United States Patent  
Janzen

(10) Patent No.: US 7,519,877 B2
(45) Date of Patent: Apr. 14, 2009

(54) MEMORY WITH TEST MODE OUTPUT

(75) Inventor: Jeffery W. Janzen, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 252 days.

(21) Appl. No.: 10/915,663

(22) Filed: Aug. 10, 2004

(65) Prior Publication Data

US 2006/0036916 A1 Feb. 16, 2006

(51) Int. Cl.
*G11C 29/46* (2006.01)
*G11C 29/54* (2006.01)

(52) U.S. Cl. ........................................ 714/718; 714/42

(58) Field of Classification Search ................ 714/718, 714/25, 42, 54, 702; 365/200, 201
See application file for complete search history.

(56) References Cited

U.S. PATENT DOCUMENTS

| | | | |
|---|---|---|---|
| 4,724,378 A * | 2/1988 | Murray et al. ............... 714/738 |
| 5,446,691 A | 8/1995 | North | |
| 5,619,461 A * | 4/1997 | Roohparvar ................ 365/201 |
| 5,745,415 A * | 4/1998 | Marr ........................ 365/201 |
| 5,821,760 A * | 10/1998 | Koeman et al. ............. 324/628 |
| 6,021,459 A * | 2/2000 | Norman et al. ................ 711/5 |
| 6,040,719 A * | 3/2000 | Earl ............................ 327/78 |
| 6,141,273 A * | 10/2000 | Ku et al. .................... 365/201 |
| 6,219,292 B1 | 4/2001 | Jang | |
| 6,373,744 B1 * | 4/2002 | Mano ........................ 365/145 |
| 6,445,624 B1 | 9/2002 | Janzen et al. | |
| 6,467,032 B1 | 10/2002 | Lippert | |
| 6,538,951 B1 | 3/2003 | Janzen et al. | |
| 6,628,999 B1 * | 9/2003 | Klaas et al. ................... 700/94 |
| 6,647,470 B1 | 11/2003 | Janzen | |
| 6,658,523 B2 | 12/2003 | Janzen et al. | |
| 6,678,205 B2 | 1/2004 | Johnson et al. | |
| 6,724,666 B2 | 4/2004 | Janzen et al. | |
| 6,775,759 B2 | 8/2004 | Janzen | |
| 6,779,074 B2 | 8/2004 | Janzen | |
| 6,842,398 B2 | 1/2005 | Johnson et al. | |
| 6,845,433 B2 | 1/2005 | Janzen | |
| 6,847,583 B2 | 1/2005 | Janzen et al. | |
| 6,851,016 B2 | 2/2005 | Janzen et al. | |
| 6,851,032 B2 | 2/2005 | LaBerge et al. | |
| 6,931,483 B2 | 8/2005 | Janzen | |
| 2001/0008005 A1 | 7/2001 | Stevens et al. | |
| 2002/0027795 A1 * | 3/2002 | Endo ......................... 365/120 |
| 2004/0039883 A1 | 2/2004 | LaBerge et al. | |
| 2004/0098528 A1 | 5/2004 | Janzen | |
| 2004/0123196 A1 * | 6/2004 | Shidla et al. ................ 714/724 |
| 2004/0162935 A1 | 8/2004 | Janzen | |
| 2005/0027959 A1 | 2/2005 | LaBerge et al. | |
| 2005/0094432 A1 | 5/2005 | Johnson et al. | |
| 2007/0168780 A1 | 7/2007 | Janzen | |

* cited by examiner

*Primary Examiner*—Cynthia Britt
*Assistant Examiner*—Dipakkumar Gandhi
(74) *Attorney, Agent, or Firm*—Schwegman, Lundberg & Woessner, P.A.

(57) ABSTRACT

Apparatus and methods of forming and operating the apparatus provide an instrumentality for a memory to generate a test mode signal to trigger a test in response to the memory detecting a predetermined command from a system bus. In an embodiment, a mode register in the memory includes an indicator to enable or disable issuance of a test mode signal from the memory. The mode register may contain information identifying the predetermined command.

65 Claims, 9 Drawing Sheets

MEMORY WITH TEST MODE OUTPUT

FIELD OF INVENTION

The present invention relates generally to memory devices, more particularly to test modes of the memory devices.

BACKGROUND

With increasing speeds for moving data around a system, the problems associated with system test or debug increases. For system debug, key commands going to a memory device such as a dynamic random access memory (DRAM), for example, need to be identified. This identification is made to determine if the correct command was received by the DRAM. Further, once this identification is made, a test instrument such as an oscilloscope can be used to capture other signals.

System test and debug is becoming increasingly difficult due to complexities associated with accessing all signals on packages such as fine-pitch ball grid array (FBGA) packages, since a signal can be on an internal layer and a contact via can be under a chip component. Additionally, adding a probe in the middle of a trace on a chip can cause extra loading creating system fails or system marginality changes. Also increasing speeds used on system buses adds to the complexity of system debug. For DRAMs such as double data rate (DDR) DRAMS, the speed on the command address bus is in the range of up to 400 megahertz going towards 800 megahertz. At these speeds with the application of a test probe to the chip, impedance is altered basically causing signal integrity issues and concerns.

DETAILED DESCRIPTION OF THE EMBODIMENTS

Figure 1:
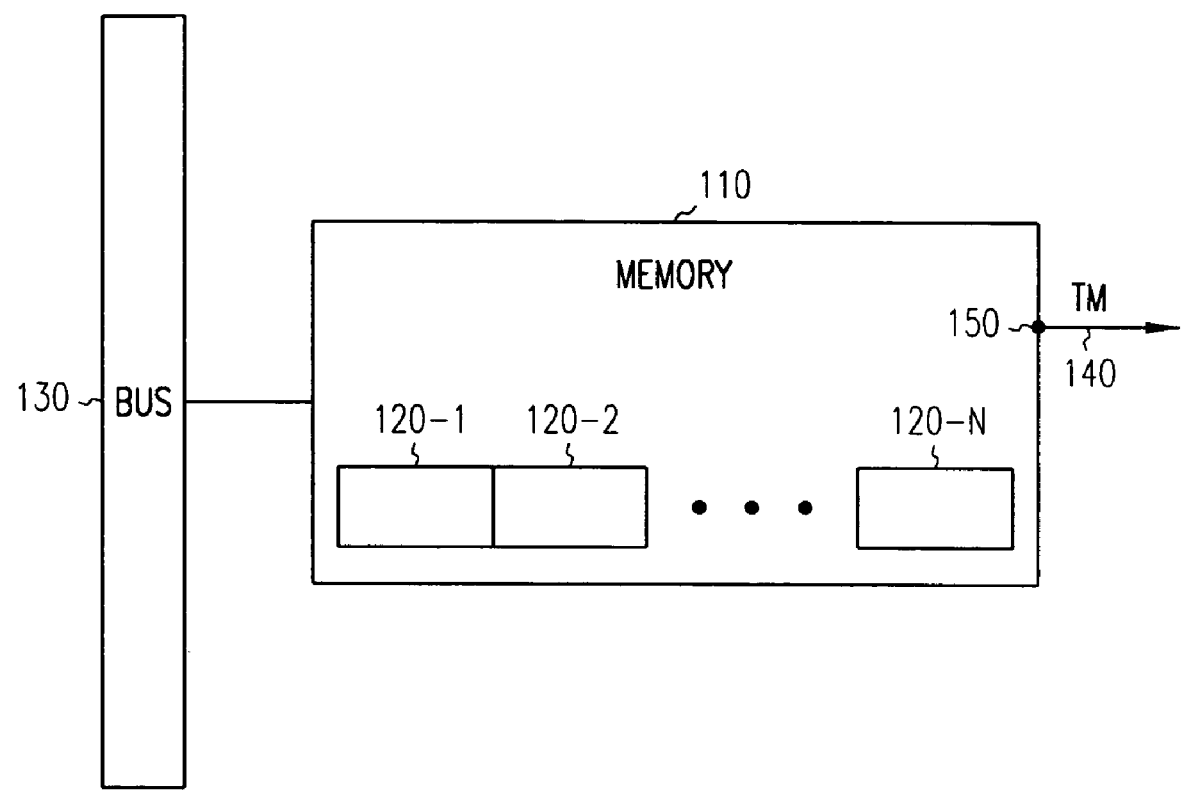
FIG. 1 depicts an embodiment of a memory having a number of bit locations that store information to issue a test mode signal from the memory to trigger a test in response to the memory detecting a particular command from a system bus, according to the teachings of the present invention.

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some disclosed embodiments can be combined with one or more other disclosed embodiments to form new embodiments. The following detailed description is, therefore, not to be taken in a limiting sense, and the scope of the embodiments of the present invention is defined only by the appended claims, along with the full scope of equivalents to which such claims are entitled.

Embodiments of methods and apparatus include using information stored in a memory to output a test mode signal to trigger a test in response to the memory detecting a particular command from a system bus. The information may be stored in mode registers of the memory.

In various embodiments, a trigger to test a memory is generated by the memory when the memory determines that a particular command has been received from a system bus. An embodiment allows for determining that the particular command has been received. Other embodiments allow for determining that the particular command has been received and for examining data in the memory associated with this particular command. This provides a debug configuration that does not use additional circuitry in a different electronic component such as a different integrated circuit or chip that would look at that the output of the memory device to trigger test equipment. By having the trigger in the memory device in various embodiments, additional integrated circuits or probes are not added onto the system bus and the signal integrity may be maintained for system debug. With a test mode signal triggered by the memory, test equipment can be used with knowledge regarding exactly what commands are coming into the memory. Additionally, the communication between a controller and a memory can be tested by sending a command from the controller directed to the memory for which the memory is predetermined to monitor so that verification that whatever command the controller sends out the same command is being read by the memory.

In an embodiment, during initialization of a memory, a command is set in the memory for which the memory monitors to determine if it receives this command. The memory is enabled to trigger the output of a test mode signal upon determining that the set command has been received. This information regarding the set command and an enable to trigger the output of the test mode signal may be realized within a mode register set. The mode register set is programmable and may optionally store address information. A set of mode registers on the memory, such as a DRAM, may be used to change the operation of the memory device. Alternately, a unique command may be used to control the memory device to trigger the output of a test mode signal upon determining that the set command has been received.

The command to be monitored and/or the enable to trigger the test mode signal may also be set at times in the operation of the memory other than at initialization. This change to the configuration of the memory may be performed at any time, as long as there are no transactions in progress. For a DRAM in a precharged state where all banks of the DRAM are precharged in a steady state, the mode registers of the DRAM can be changed and then operated in a new mode without reinitializing, which provides more flexibility of operation.

After configuration of the memory, during operation, if the memory decodes a command it receives as a match to the specified command, the memory generates a test mode signal. The test mode signal may be used to trigger test equipment such as a typical testing scope. The test mode signal may be output on a unique test pin. Alternately, a pin used for calibration may be used to output the test mode signal.

FIG. 1 depicts an embodiment of a memory 110 having a number of bit locations 120-1, 120-2 . . . 120-N that store information to issue a test mode signal, TM, 140 from memory 110 to trigger a test in response to the memory detecting a particular command from a system bus 130. The information stored in the bit locations 120-1, 120-2 . . . 120-N may include an indicator that acts as an enable or disable to the issuance of the test mode signal 140 by memory 110. The information stored may also include information identifying the particular command to be monitored as the trigger to issue the test mode signal 140. The particular command may be encoded as a predetermined set of control signals to be received at memory 110 from system bus 130. In another embodiment, the information stored may optionally include an address correlated to the particular command to be detected. The actual number of bit locations used may be selected for a given application and the number of bit locations may be configured in a variety of formats as can be appreciated by those skilled in the art. In an embodiment, the number of bit locations is configured as bit locations in one or more registers of memory 110. In an embodiment, the number of bit locations is configured as bit locations in a number of mode registers of memory 110.

Memory 110 may include a test mode port 150 at which test mode signal 140 is output if memory 110 is enabled to monitor for a predetermined command and the memory detects the predetermined command. Test mode port 150 may be realized as a calibration port of memory 110. When the predetermined command is detected with the test mode signal generation enabled, memory 110 terminates any calibration mode using calibration port 150 and transmits test mode signal 140 from calibration port 150. Alternately, test mode port 150 may be realized as a unique test pin for outputting the test mode signal 140. In embodiments described herein, a port of a device is a location at the device at which signals can be received and/or transmitted. In an embodiment, a port is a pin in the housing of the device such as a pin in an integrated circuit.

Memory 110 may be realized in various embodiments and is not limited to any one type of memory. Memory 110 may be a memory configured as a portion of an integrated circuit having functionality other than as a memory such as a control device fabricated as an application specific integrated circuit (ASIC) or a processor. Memory 110 may be a memory configured as a memory integrated circuit. Memory 110 may be fabricated as a dynamic random access memory such as a double data dynamic random access memory or other form of memory integrated circuit.

Figure 2:
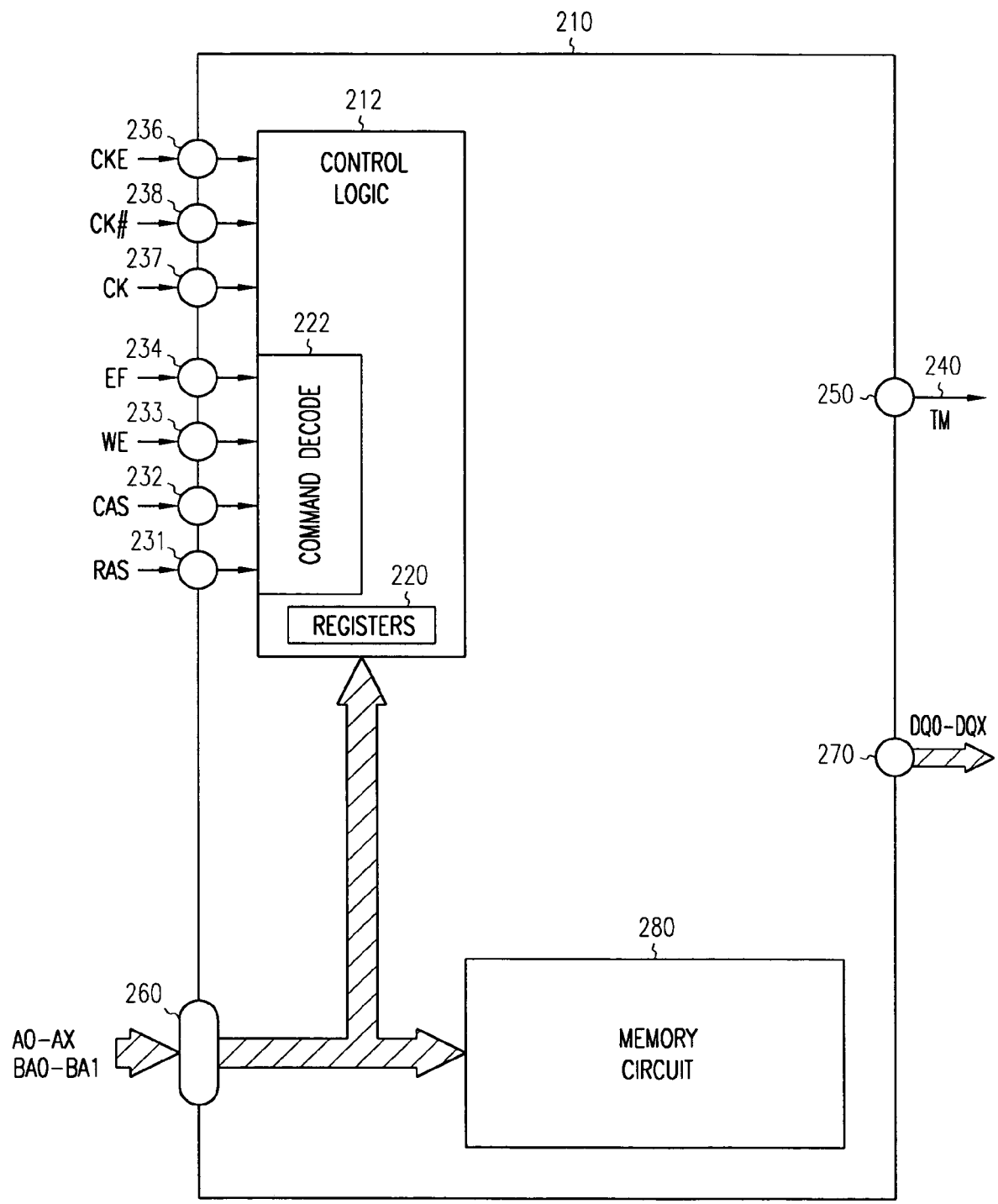
FIG. 2 depicts an embodiment of a memory having a number of mode registers that store information to generate a test mode signal from the memory to trigger a test in response to the memory detecting a particular command from a system bus, according to the teachings of the present invention.

FIG. 2 depicts an embodiment of a memory 210 having a number of mode registers 220 that store information to issue a test mode signal, TM, 240 from memory 210 to trigger a test in response to memory 210 detecting a particular command from a system bus. For convenience, FIG. 2 does not contain all the elements of memory 210, but contains those elements of a memory necessary for understanding the embodiments discussed, as can be appreciated by those skilled in the art. Memory 210 may include input ports 231-234 for signals: row address strobe (RAS), column address strobe (CAS), write enable (WE), and an additional extended function (EF), respectively. Extended function EF may be a control signal defined by the application in which it is used. In an embodiment, the EF signal provides an addition bit to be used with the bits provided by signals RAS, CAS, and WE to set or identify a command for which memory 210 monitors. Signals RAS, CAS, WE, and EF may be applied to memory 210 in their normal logic format or in an inverted format. Additionally, signals RAS, CAS, WE, and EF may be provided to memory 210 as part of a system bus. Communication lines to a memory to provide command and/or control signals to the memory may be considered as forming a system control bus. These communication lines may be realized as a standard bus or as a collection of individual lines providing electrical conductivity on which command and control lines may propagate.

Memory 210 may also include control logic 212 that receives signals RAS, CAS, WE, and EF along with a clock enable (CKE), a clock (CLK), and an inverted clock (CLK#) at input ports 236, 237, and 238, respectively. Memory 210 has a command decode 222 to decode commands that are encoded through the use of signals RAS, CAS, WE, and EF. Memory 210 also includes address ports 260 to receive an address from a system address bus, data ports 270 to transmit data to a system data bus, and a memory circuit 280 that contains data stored in memory 210. Memory circuit 280 is coupled to address input ports 260 for receiving information identifying the location for reading or writing data from/to data ports 270. The identification of the location is contained in BA0-BA1 for selecting a memory bank and in A0-AX for selecting an address within a memory bank. The management of the read and write operations is performed by control logic 212 upon receiving commands from a controller such as a processor or other electronic device used to access memory 210. Data is clocked out data ports 280 from memory circuit 270 for transferal to system data bus locations DQ0-DQX.

The one or more mode registers 220 are programmed with information for operating memory 210. This information may include information identifying a command for which memory 210 is to monitor. This information may use any number of bits to identify the command. In an embodiment, the information identifying the command is encoded with a number of bits correlated to a number of control signals received by memory 210 from a controller such as a processor or other device that loads the mode registers of memory 210. In an embodiment, a mode register in the set of mode registers 220 includes four bits to identify the monitored command. These four bits are correlated to the control signals RAS, CAS, WE, and EF received at ports 231-234.

The information programmed or loaded into mode registers 220 may include an indicator that that acts as an enable or disable to the issuance of the test mode signal 240 by memory 210 upon detecting the command that memory 210 is to set to monitor. The enable/disable indicator may use a number of bit locations in mode registers 220. In an embodiment, the enable/disable indicator enables or disables control logic 212 from comparing the control signals decoded by command decode 222 and the command encoded in the mode registers 220. In an embodiment, the enable/disable indicator and the information identifying the monitored command are contained in the same mode register. Alternately, the enable/disable indicator and the information identifying the monitored command are contained in different mode registers. The mode registers containing one or more of the enable/disable indicator and the information identifying the monitored command may be extended mode registers such as available in a DDR.

The information programmed or loaded into mode registers 220 may include an address correlated to the monitored command. In an embodiment, this address uses a number of bit locations in mode registers 220 equal to the number of bits for a memory location in memory circuit 280. In an embodiment, this address loaded in mode registers may include an address and a bank identification depending on the memory type or just the address or information identifying the address. In an embodiment, the enable/disable indicator and the address are contained in the same mode registers. In an embodiment, the enable/disable indicator is contained in the mode register having the information identifying the monitored command and in the register having the address correlated to the monitored command, while the information identifying the monitored command and its correlated address are in different mode registers. The mode registers containing one or more of the enable/disable indicator, the information identifying the monitored command, and the addressed correlated to the monitored command may be extended mode registers such as available in a DDR.

Memory 210 uses one or more registers as mode registers in which operating information is programmed into memory 210 by a controller, typically, on initialization or boot up (start of system). The mode registers 220 may also be loaded during operation of memory 210. This allows for change of the command to be monitored without re-initializing memory 210 and for continued normal functioning of memory 210.

Memory 210 may include a test mode port 250 at which test mode signal 240 is output if memory is enabled to monitor for a predetermined command and the memory detects the predetermined command. Test mode port 250 may be realized as a unique test pin to output test mode signal 240. Test mode port 250 may be realized as a calibration port of memory 210, which eliminates the need for an additional pin dedicated to providing test mode signal 240. With memory 210 realized as a DRAM, DRAM 210 is powered up normal mode with time allowed for calibration. After time for calibration has been provided, the test mode is entered by providing the predetermined command to DRAM 210. DRAM 210 automatically disables output calibration using the last known valid value. For example, if the output driver of DRAM 210 has 16 steps in it between the pull up and pull down, different strengths, and the last time it was calibrated it was at step number 7, DRAM 210 would freeze that calibration at the values it knows for the process, voltage, and temperature of its working parts. If DRAM 210 is in a test environment, this cessation of the calibration should be sufficient because the voltage and temperature are not drifting over the whole operating range, since it is a test mode and not a full operating mode. As long as the voltage and temperature do not move dramatically, DRAM 210 will stay very near calibration.

In an embodiment, a calibration pin of a memory 210 has a precision resistor that is tied to one of the power rails such as ground. On an as-needed basis, memory 210 measures either the voltage or current going through the precision resistor in order to calibrate the output drivers. Test mode port 250 is primarily used for output driver calibration. To facilitate the calibration and still use test mode port 250 to output test mode signal 240 a delay in setting up the mode register sets may be provided until after the calibration is done. The end of the delay for calibration may be accomplished by transmitting to memory 210, the predetermined command for which it is set to monitor according to the information in the mode register sets. When the predetermined command is detected with the test mode signal generation enabled, memory 210 terminates any calibration mode using calibration port 250 and transmits test mode signal 240 from calibration port 250.

The elements of memory 210 may be fabricated using conventional processing means for forming the various circuits within a selected semiconductor material and for providing electrical connections for coupling to a system address bus, a system data bus, and system control lines for communication with a controller or a processor.

Figure 3:
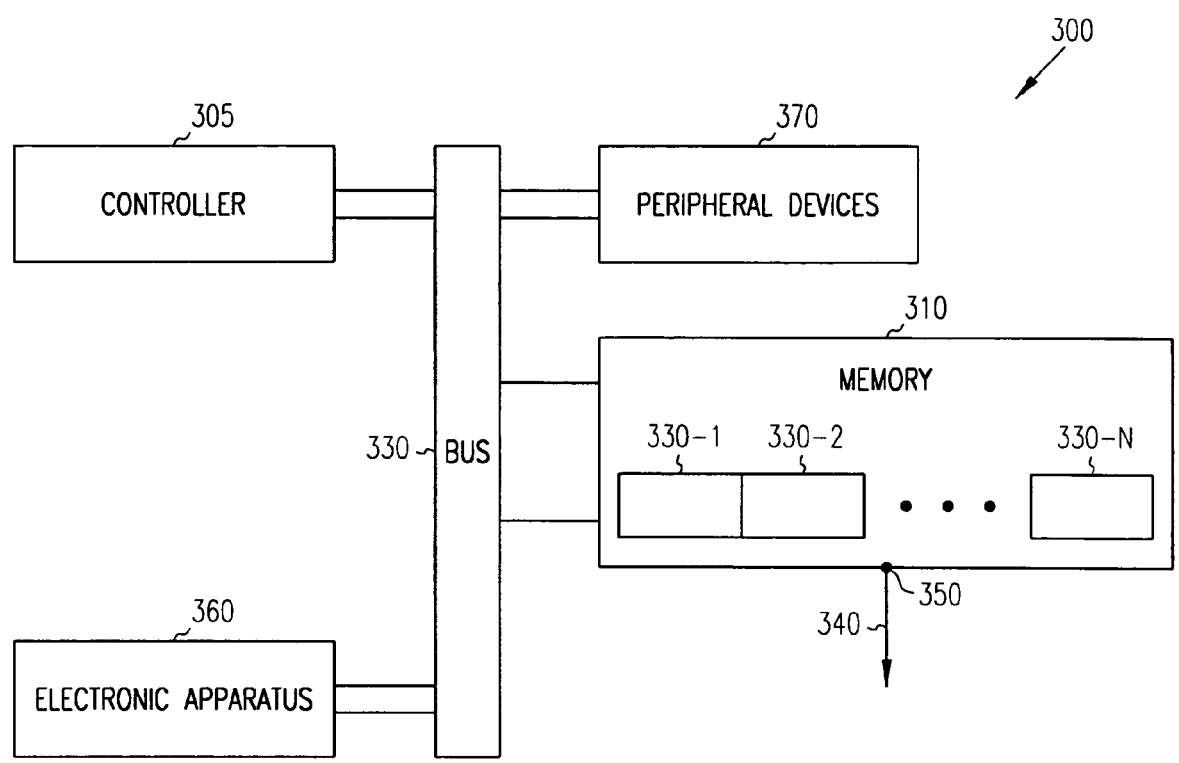
FIG. 3 depicts a block diagram of an embodiment of a system having a memory with a number of bit locations that store information to issue a test mode signal from the memory to trigger a test in response to the memory detecting a particular command from a system bus, according to the teachings of the present invention.

FIG. 3 depicts a block diagram of an embodiment of a system 300 having a memory 310 with a number of bit locations 330-1, 330-2 . . . 330-N that store information to issue a test mode signal 340 from memory 310 to trigger a test in response to memory 310 detecting a particular command from a system bus 330. Memory 310 may be realized in various embodiments including the embodiments of FIGS. 1 and 2. System 300 includes a controller 305, an electronic apparatus 360, and a bus 330, where bus 330 provides electrical conductivity between controller 305 and electronic apparatus 360, and between controller 305 and memory 310. Bus 330 may include an address, a data bus, and a control bus, each independently configured. Alternately, bus 330 may use common conductive lines for providing address, data, and/or control, the use of which is regulated by controller 305. In an embodiment, electronic apparatus 360 may be additional memory configured similar as memory 310. An embodiment may include an additional peripheral device or devices 370 coupled to bus 330. System 300 may include, but is not limited to, information handling devices, telecommunication systems, and computers.

In an embodiment, controller 305 controls programming or loading of the number of bit locations 330-1, 330-2 . . . 330-N with the information used to issue a test mode signal 340 from memory 310 to trigger a test in response to memory 310 detecting a particular command from a system bus 330. The controller may be adapted to load this information into the number of bit locations 330-1, 330-2 . . . 330-N configured as part of the mode registers of memory 310. These mode registers may realized as extended mode registers. In an embodiment controller 305 is a processor. In an embodiment, controller 305 is processor and electronic apparatus 360 include memory devices configured similar to memory 310.

The test mode signal 340 may be transmitted from test mode port 350 by sending the test mode signal 340 to test equipment coupled to bus 330 such as peripheral device 370. Alternately, test mode port 350 may be accessed directly by test equipment that respond to the test mode signal 340 provided at this port. Test mode port 350 may be realized as a calibration port of memory 310. In an embodiment, test mode port 350 may be a unique test pin of memory 310 to provide the test mode signal 340.

Peripheral devices 370 may include displays, additional storage memory, or other control devices that may operate in conjunction with controller 305. Alternately, peripheral devices 370 may include displays, additional storage memory, or other control devices that may operate in conjunction with controller 305 and/or memory 310.

Figure 4:
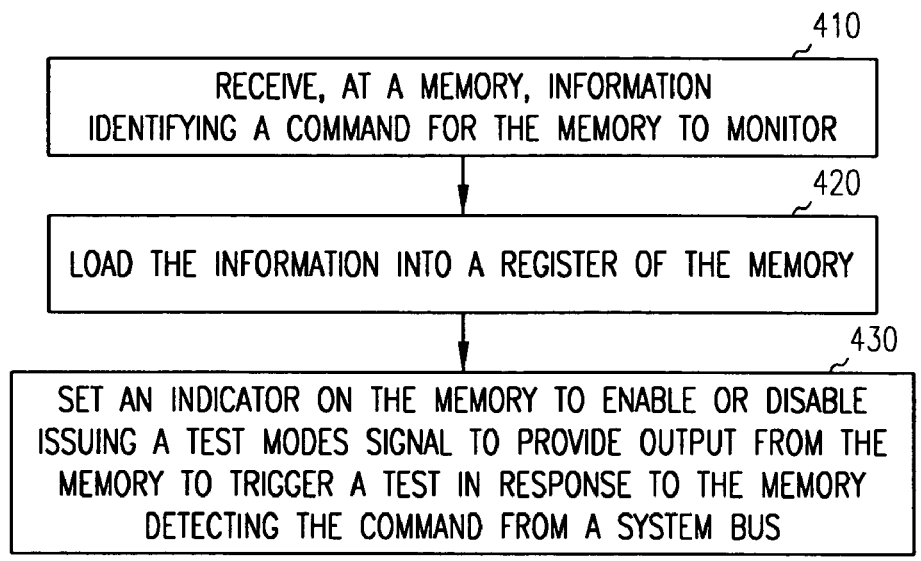
FIG. 4 shows a flow diagram of an embodiment of a method for a memory to configure itself to trigger issuance of a test mode signal in response to the memory detecting a command from a system bus, according to the teachings of the present invention.

FIG. 4 shows a flow diagram of an embodiment of a method for a memory to configure itself to trigger issuance of a test mode signal in response to the memory detecting a command from a system bus. The memory may be configured similar to the embodiments of FIGS. 1-3. At 410, a memory receives information identifying a command for the memory to monitor. This information may be received at the memory during initialization following power-up. Alternately, the information is received during operation of the memory. In an embodiment, this information is received from the system address bus or other system bus that normally provides addresses for the memory.

At 420, the memory loads the information into a register of the memory. The register provides a set of bit locations to contain information to operate the memory. In an embodiment, the register is a mode register. As can be appreciated by those skilled in the art, a mode register also includes extended mode registers depending on the configuration and/or type of memory utilized. The information loaded into the register identifies the command for the memory to monitor in the form of a set of bits encoded to represent the identified command. This set of bits may vary in the number of bits used to identify the command depending on the particular application. In an embodiment, the information identifying the command to monitor is provided using four bits, which allows identification of sixteen commands.

At 430, the memory sets an indicator to enable or disable issuing a test mode signal to provide output from the memory to trigger a test in response to the memory detecting the command from a system bus. The enable/disable indicator may be set by loading the information into the register of the memory. In an embodiment, indicator bits are received by the memory when the memory receives information identifying the command to monitor. The indicator bits and the identifying information may be provided in data loaded into the mode registers of the memory. These two sets of data may be provided in the same address received at the memory to load a mode register of the memory.

The data used in issuing a test mode signal may be loaded by the memory into a number of mode registers. Optionally, an address correlated to the command to monitor may also be loaded into the mode registers of the memory. In an embodiment, the memory may load one register with an enable/disable indicator and the information identifying the monitor command and may load another register with an enable/disable indicator and the address correlated to the monitor command.

Figure 5:
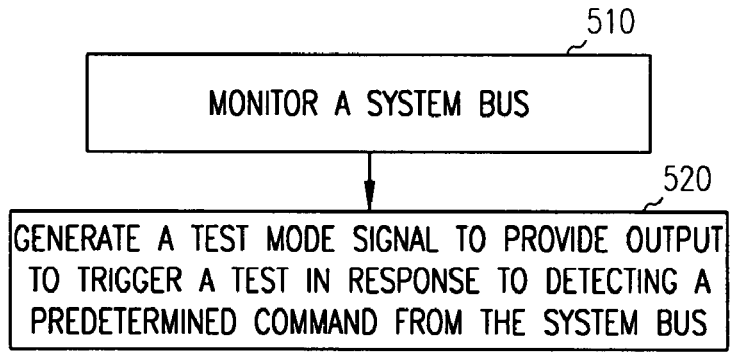
FIG. 5 shows a flow diagram of an embodiment of a method for operating a memory to generate a test mode signal, according to the teachings of the present invention.

FIG. 5 shows a flow diagram of an embodiment of a method for operating a memory to generate a test mode signal. At 510, embodiments of a memory, such as those in FIGS. 1-3, monitor a system bus to detect the arrival of a predetermined command from a system bus. Commands from the system bus are decoded and compared against the predetermined command stored in a number of bit locations in the memory. These bit locations may be part of a memory register such as a mode register. In an embodiment, such a comparison is made only if the memory has been set to enable the generation of the test mode signal. In an embodiment, such a comparison is made but the memory only reacts to the result of the comparison if the memory has been set to enable the issuance of the test mode signal.

At 520, the memory issues the test mode signal to provide output to trigger a test in response to detecting the predetermined command from the system bus. In an embodiment, this issuance is conducted only if the memory is enabled to perform the issuance and the memory detects the predetermined command. The test mode signal may be output to trigger a test using apparatus coupled to the memory. The test mode signal may be generated as a single asynchronous pulse or as a single synchronous pulse. In addition, data associated with the predetermined command may be output to the system data bus, since the generation of the test mode signal and the subsequent triggered test can be performed as the memory normally operates according to the application in which the memory is configured.

Figure 6:
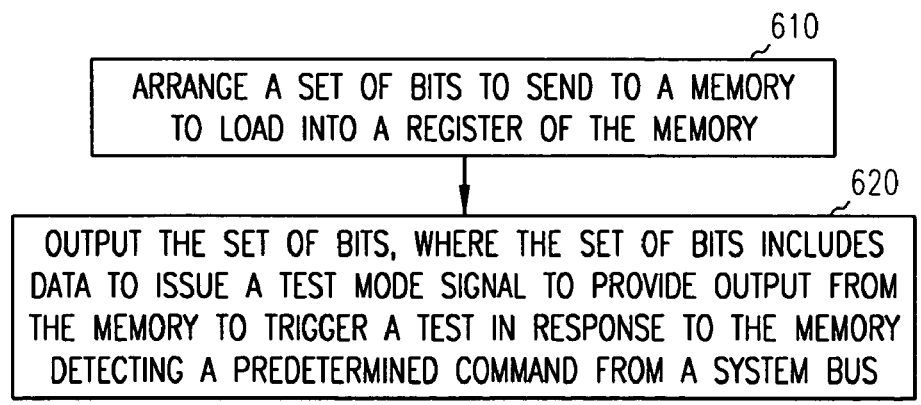
FIG. 6 shows a flow diagram of an embodiment of a method for configuring a memory to generate a test mode signal in response to the memory detecting a command from a system bus, according to the teachings of the present invention.

FIG. 6 shows a flow diagram of an embodiment of a method for configuring a memory to generate a test mode signal in response to the memory detecting a command from a system bus, according to the teachings of the present invention. A controller such as a processor or other controller that is used to program a set or sets of bits that provide operating instructions to a memory may be used to configure the memory in such a manner. The controller and memory may be coupled through a system bus such as shown in the embodiment of FIG. 3.

At 610, a controller arranges a set of bits to transmit to a memory to load into a register of the memory. The set of bits may be arranged in a specific order to correspond to locations in a bit pattern to be transmitted to the memory, such as an address on an address bus. The set of bits may also be arranged such that on reception of these bits, the memory loads specific bits into portions of one or more registers in the memory. After arranging the bits, at 620, the controller outputs the set of bits for the memory to receive. These bits may be modified, including re-arrangement, by controllers that operate as an intermediary between an initial processor that determines the set of bits and a particular memory to receive the set of bits.

Figure 7:
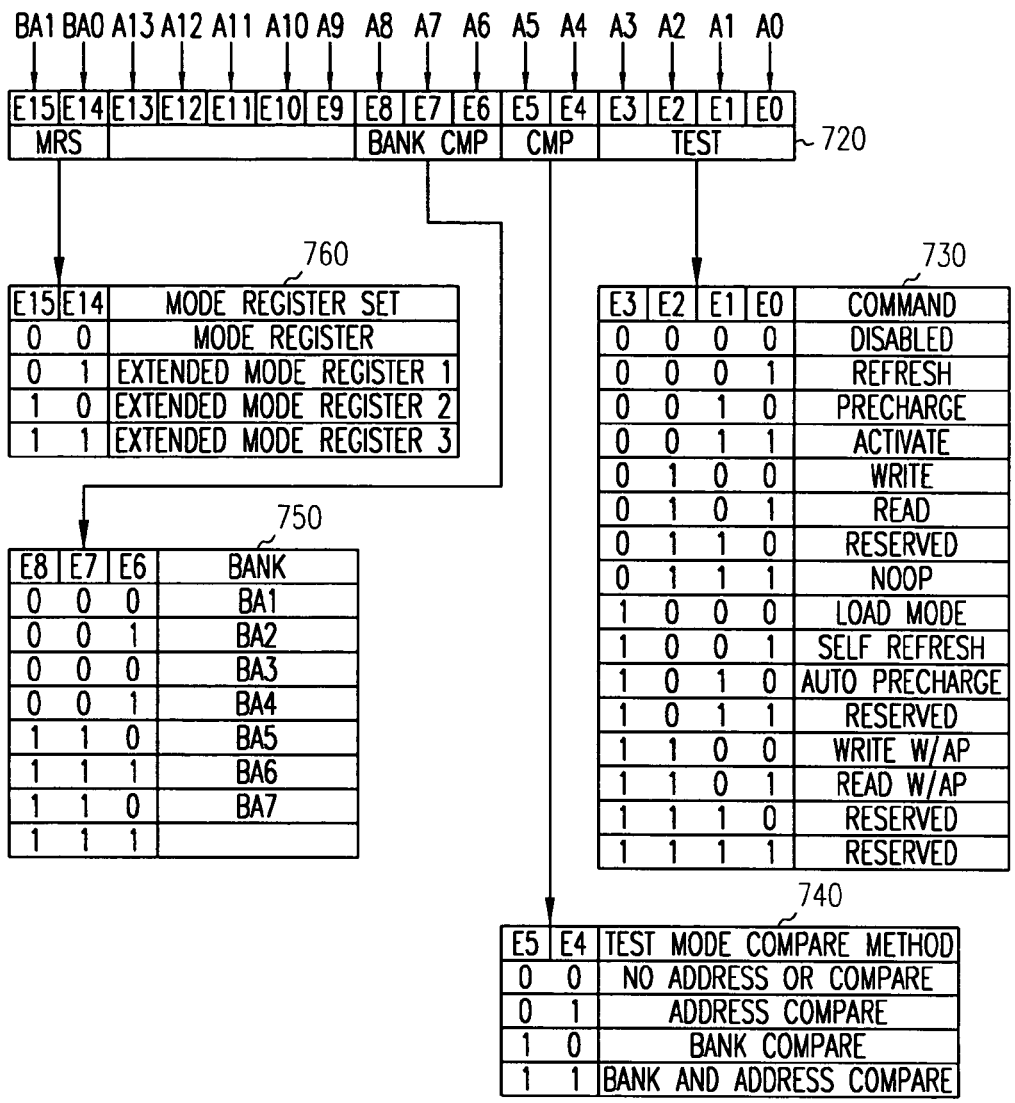
FIG. 7 shows an embodiment of an extended mode register of a memory, where the extended mode register has a number of bit locations, which provide information to issue a test mode signal to trigger a test in response to the memory detecting a predetermined command from a system bus, according to the teachings of the present invention.

FIG. 7 shows an embodiment of an extended mode register 720 of a memory, where extended mode register 720 has a number of bit locations, which provide information to generate a test mode signal to trigger a test in response to the memory detecting a predetermined command from a system bus. Such extended mode registers can be applied to memories such as DDRs. In other embodiments, registers and/or mode registers for other memory devices may be configured in a similar manner. Bits or groups of bits may be associated with identifying the predetermined command to monitor and with methods for comparing the predetermined command with respect to a decoded command as shown in tables 730, 740, 750, and 760.

In the embodiment illustrated in FIG. 7, extended mode register 720 includes bit locations E0, E1, E2, and E3 for identifying the predetermined command to monitor. In this particular embodiment, four bits are used to identify the predetermined command as one of sixteen possible commands. Depending on the application not all of the sixteen possibilities will be used in a test mode. In table 730, E3-E0 word or values set to 0000 disables the issuance of the test mode signal. E3-E0 word or values set to values other than 0000 set the predetermined command to one of the following: refresh, precharge, activate, write, read, NOOP (no operation), load mode, self refresh, auto precharge, write w/AP (write with auto precharge), read w/AP (read with auto precharge). In table 730, E3-E0 word or values for the E3-E0 bits corresponding to 0110, 1011, 1110, and 1111 are not used in this exemplary embodiment but may be reserved for other possible command formats. A determination that E3-E0 bits for extended register 720 contains a bit not used may be an indication of a fault in the process for loading extended register 720.

In an embodiment, the memory may be configured to use one of several methods for comparing the predetermined command with a decoded command from the system bus. The methods may include comparing a bank identification, comparing an address correlated to the predetermined command, comparing a bank identification and an address correlated to the predetermined command, or comparing the predetermined command and the decoded command without comparing a bank identification and without comparing a correlated address. In the embodiment shown in FIG. 7, the method is identified in extended mode register 720 using bit locations E4, E5 which provide the four comparison methods as shown in table 740.

Use of a bank identification depends on the use of a memory in which the memory is arranged in terms of banks. In such memories as shown in FIG. 7, when the comparison method selected uses bank compare or bank and address compare, the bank identification received with the decode command is compared with a bank identification provided by bit locations E8-E6 as shown provided by table 750. The exemplary embodiment of FIG. 7, the memory has seven blocks using three bits to identify the bank, though one word or value set for E8-E6, namely 111 in this example embodiment, is not used.

With the number of bits of a mode register such as extended mode register corresponding to the bits from an address bus, the compare methods using an address may use an additional extended mode register to hold the compare address. With the compare address provided in a register other than extended mode register 720, the remaining bits may be used for other purposes than for a test mode. However, a number of bit locations may be used to identity which mode register or extended mode register is used as mode register 720 in a set of mode registers. With the number of mode registers limited to four, two bit locations, E15, E14 are used for naming extended mode register 720 as shown in table 760. This leaves bit locations E13-E9 for other purposes. In memories using more than four mode registers, one or more of the bits in locations E13-E9 may be used for mode register identification.

Figure 8:
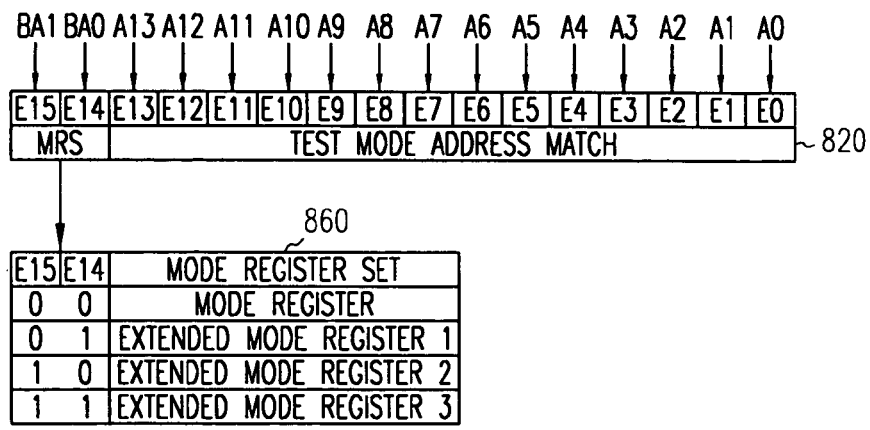
FIG. 8 shows an embodiment of another extended mode register, where this extended mode register has a number of bit locations to hold an address for an address compare if selected in the extended mode register of FIG. 7, according to the teachings of the present invention.

FIG. 8 shows an embodiment of an extended mode register 820 of a memory, where extended mode register 820 has a number of bit locations to hold an address for an address compare if selected in extended mode register 720 of FIG. 7. In the exemplary embodiment of FIG. 8, the address for address compare has fourteen bits stored in bit locations E13-E0 of extended mode register 820. Extended mode register 820 is identified in bit locations E15-E14 as provided in table 860. Use of extended mode register 820 allows for the testing of specific addresses that generated a failed condition on being received by a memory.

The extended mode registers 720, 820 of a memory such as memory 310 of FIG. 3 is operatively coupled to the system address bus for programming by a controller such as controller 305 of FIG. 3. Controller 305, or an intermediate controller, may program information into the mode register or extended mode register during initialization, or at other times during operation of memory 310, using the address bus. In the embodiment discussed with respect to FIGS. 7 and 8, the address bus is configured for a 14 bit address with a 2 bit bank identification.

The extended mode registers, or other registers and/or mode registers, can be used to program one or more bits in a memory for use in testing. In an embodiment, a data structure for the extended mode register includes a field containing data representing information to issue a test mode signal from the memory to trigger a test in response to the memory detecting a predetermined command from a system bus. In an embodiment, the field contains data representing an indication or flag to enable or disable issuing the test mode signal from the memory. Such a data structure may be used in programming a memory configured to trigger a test mode in which one or more commands for test are fixed but not programmed while the enable or disable is programmed into the memory. In an embodiment, the field contains data representing information identifying the predetermined command. Such a data structure may be used in programming a memory configured to periodically issue a test mode signal to trigger a test in which no indicator to enable the memory is used.

In an embodiment, the data structure includes a number of fields containing data representing information to issue a test mode signal data formatted as an address to propagate on an address bus. In an embodiment, the data structure includes a field containing data representing an indication to enable or disable issuing the test mode signal from the memory, and another field containing data representing information identifying the predetermined command. In an embodiment, a data structure, such as one correlated to programming the extended mode registers of FIGS. 7 and 8, has fields containing data representing a predetermined command to be monitored, data representing an indication to enable or disable issuing the test mode signal from the memory, data representing the compare method associated with the predetermined command, and, depending on the compare method data, data representing a bank identification and an address.

Depending on the application, the extended mode registers, mode registers, or other bit locations of a memory may be programmed by a controller during initialization of the memory. Alternately, the mode registers can be programmed after initialization. In an embodiment, programming or loading such registers or bit locations after initialization may be conducted using a specified command sequence. In an embodiment, these extended mode registers, the mode registers, or other bit locations may be programmed by a controller providing a data signal for the memory embodied in a set of electrical signals including data representing information to issue a test mode signal to provide output from the memory to trigger a test in response to the memory detecting a predetermined command from a system bus. In an embodiment, the data includes a data portion to enable or disable issuing the test mode signal. In an embodiment, the data includes a data portion to identify the predetermined command. In an embodiment, the data includes a data portion having an address associated with the predetermined command.

The controller programs these mode registers based on instructions stored in a computer readable medium that the controller accesses for initialization instructions and/or for loading these extended mode registers, mode registers, or other bit locations of a memory for specific functions such as conducting test mode activities. This computer readable medium may be memory locations within the controller or any other computer readable medium operatively coupled to the controller. The computer-readable medium has computer-executable instructions for performing a method including arranging a set of bits to send to a memory to load into a register of the memory, and outputting the set of bits. The set of bits may be formatted to be loaded into a mode register of the memory. Depending on the application, the mode register may be an extended mode register. A format may include an arrangement of the set of bits into an address. The computer-executable instructions may include instructions to transmit the set of bits formatted as an address onto an address bus to the selected memory. The set of bits includes data to issue a test mode signal to provide output from the memory to trigger a test in response to the memory detecting a predetermined command from a system bus. In an embodiment, the set includes data to provide an indication to enable or disable the issuing of the test mode signal from the memory. In an embodiment, the set includes data to identify the predetermined command. It can be appreciated by those skilled in the art, that the computer readable medium accessed by a controller or processor may be of any computer readable form such as, but not limited to, CD-ROMs, nonvolatile ROM, ROM, and RAM.

Figure 9:
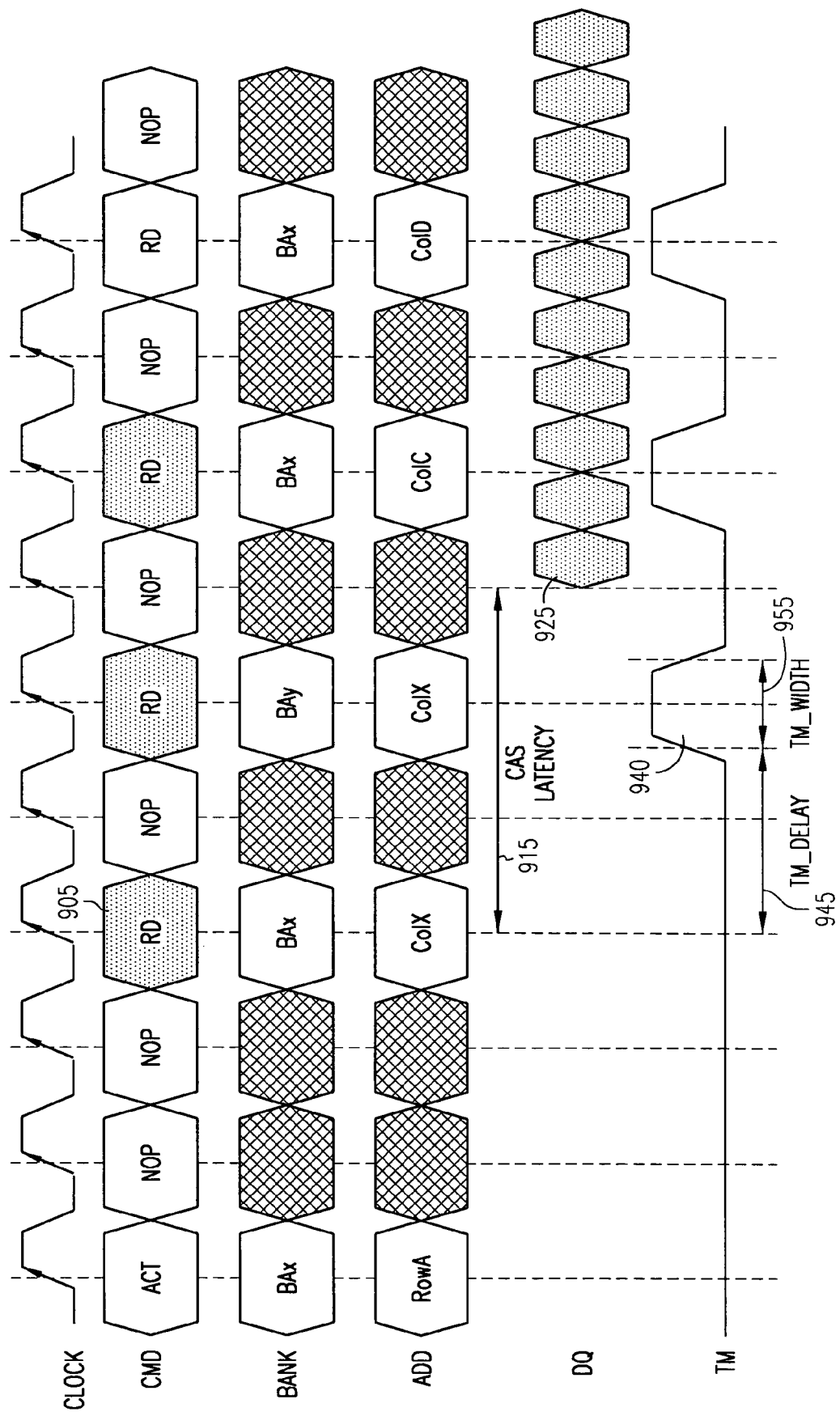
FIG. 9 illustrates an embodiment of a timing diagram for issuing a test mode signal on detecting the presence at the memory of a predetermined command, according to the teachings of the present invention.

FIG. 9 illustrates an embodiment of a timing diagram for issuing a test mode signal 940 on detecting the presence at a memory of a predetermined command. In this embodiment, a mode register of the memory is configured to enable comparison of commands received by the memory with a READ command to generate test mode signal 940. In the comparison process a bank address and column address received with the READ (RD) command 905 are ignored. The mode registers may be set with data to direct the memory to ignore the bank address and column address. Alternately, the memory may be configured to only compare received commands with a predetermined command, such as a READ command, without considering its associated bank address and/or column address. Such a memory may be configured to perform the comparison with a predetermined command or may have a comparison indicator or flag set in a register. The register may be a mode register, including an extended mode register.

As shown in FIG. 9, after a CAS latency 915 (time between receiving a READ command and outputting data associated with the READ command), data 925 is provided out on the data lines, DQ. Data 925 may be provided as actual data that is normally transmitted in response to receiving a READ command with its associated bank address and column address. Test mode signal 940 may be output while the memory is operating normally, that is, in an embodiment, test signal 940 doesn't affect any of the normal operation of the memory.

Sometime during the CAS latency 915 before data 925 is provided, test mode signal 940 is provided. Test mode signal 940 is generated after a time delay, TM_DELAY 945, after receiving READ command 905. Test mode signal 940 may also be provided after data 925 if CAS latency 915 is less than TM_DELAY 945. Test mode signal 940 has a time width, TM_WIDTH 955. In this embodiment, test mode signal 940 is generated as a single pulse. It is generated after the memory receives the command from the system bus that has been set as a predetermined command to be monitored by the memory. In an embodiment, the test mode is static, that is, it is effectively not clock driven. It may be realized as an asynchronous signal that has an asynchronous delay. This allows the memory to be configured without associating clocking circuitry with the pin that outputs the test mode signal 940 to avoid loading of this pin.

As can been seen in FIG. 9, in this embodiment, test mode signal 940 is generated each time a READ command 905 is received, even though each time the READ command is received the associated band address and/or column is different. For example, FIG. 9 shows a test mode signal 940 generated for each READ command 905 with band address BAx and with bank address BAy for the same column address ColX. Likewise, a test mode signal 940 is generated for each READ command 905 with column address ColC and with column address ColD for the same bank address BAx.

Figure 10:
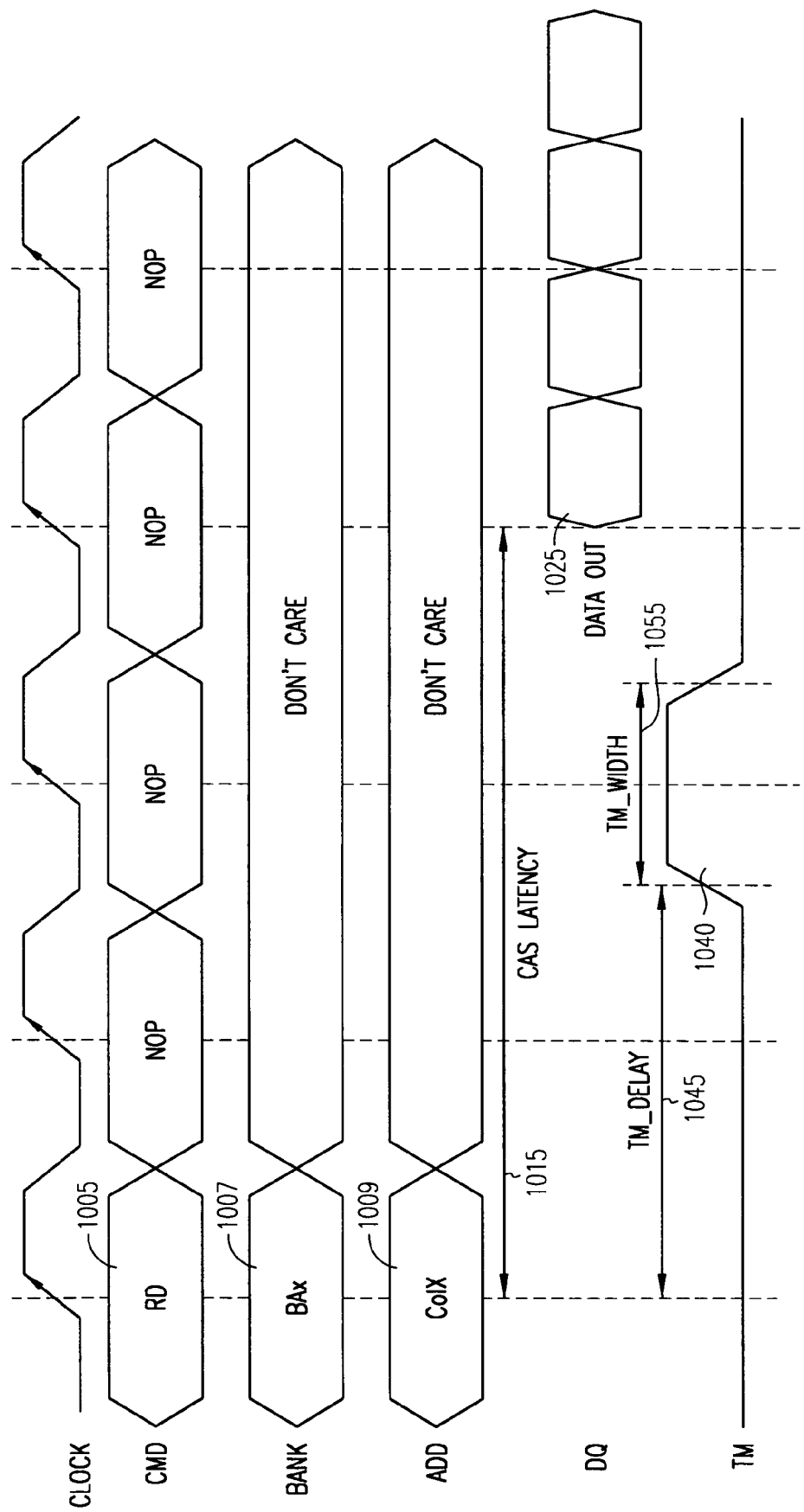
FIG. 10 illustrates an embodiment of a timing diagram for issuing a test mode signal on detecting the presence at the memory of a predetermined command including a bank and address compare, according to the teachings of the present invention.

FIG. 10 illustrates an embodiment of a timing diagram for issuing a test mode signal 1040 on detecting the presence at the memory of a predetermined command including a bank and address compare. In this embodiment, a mode register of the memory is configured to enable comparison of commands received by the memory with a READ command to generate test mode signal 1040. The comparison process includes a comparison of the bank address 1007 and column address 1009 received with the READ command 1005. The mode registers may be set with data to direct the memory to generate test mode signal 1040 on detecting READ command 1005 only if its associated bank address 1007 and/or column address 1009 have been pre-identified in the memory. The identification of the predetermined bank address and/or column address may be contained in mode registers of the memory. Alternately, the predetermined bank address and/or column address may be contained in other bit locations in the memory.

As shown in FIG. 10, after a CAS latency 1015, data 1025 is provided out on the data lines, DQ. Data 1025 may be provided as actual data that is normally transmitted in response to receiving a read command with its associated bank address and column address. Test mode signal 1040 may be output while the memory is operating normally, that is, in an embodiment, test signal 1040 doesn't affect any of the normal operation of the memory.

Sometime after READ command 1005, test mode signal 1040 is provided. Test mode signal 1040 is generated after a time delay, TM_DELAY 1045, after receiving READ command 1005. Test mode signal 1040 has a time width, TM_WIDTH 1055. In this embodiment, test mode signal 1040 is generated as a single pulse. In an embodiment, TM-WIDTH 1055 ranges from about 2 nanoseconds to about 5 nanoseconds. In an embodiment, TM-WIDTH 1055 is about 3 nanoseconds. In an embodiment, TM-WIDTH 1055 is less than about 3 nanoseconds. Test mode signal 1040 is generated after the memory receives the command and its associated bank address and column address from the system bus that has been set as a predetermined command and associated bank address and column address to be monitored by the memory. In an embodiment, test mode signal 1040 is static, that is, it is effectively not clock driven. It may be realized as an asynchronous signal that has an asynchronous delay. This allows the memory to be configured without associating clocking circuitry with the pin that outputs the test mode signal 1040 to avoid loading of this pin.

Figure 11:
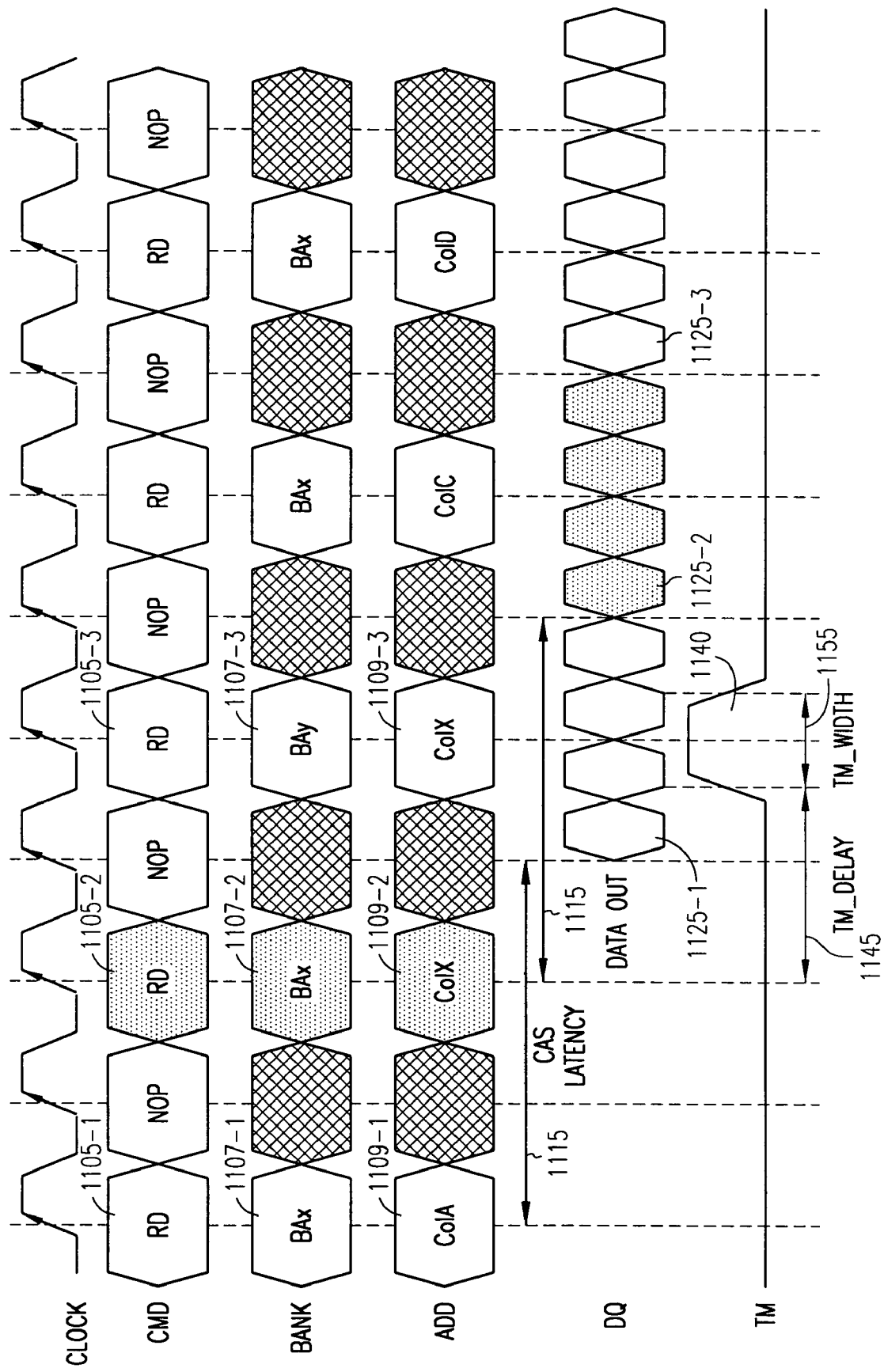
FIG. 11 illustrates another embodiment of a timing diagram for issuing a test mode signal on detecting the presence at the memory of a predetermined command including a bank and address compare, according to the teachings of the present invention.

FIG. 11 illustrates another embodiment of a timing diagram for issuing a test mode signal 1140 on detecting the presence at the memory of a predetermined command including a bank and address compare. In this embodiment, a mode register of the memory is configured to enable comparison of commands received by the memory with READ commands to generate test mode signal 1140. The comparison process includes a comparison of the bank address and column address received with the READ command. The mode registers may be set with data to direct the memory to generate test mode signal 1140 on detecting a read command only if its associated bank address and column address have been pre-identified in the memory. The identification of the predetermined bank address and column address may be contained in mode registers of the memory. Alternately, the predetermined bank address and/or column address may be contained in other bit locations in the memory.

In the embodiment of FIG. 11, the memory is configured to generate test mode signal 1140 if it detects a Read command having a bank address BAx and a column address ColX. READ command 1105-1 has an associated bank address BAx 1107-1 and a column address ColA 1109-1. After a CAS latency 1115 after receiving READ command 1105-1, data 1125-1 from bank address BAx 1107-1 and column address ColA 1109-1 is provided out on the data lines, DQ. However, a test mode signal is not generated on detecting READ command 1105-1, since its associated column address is ColA, which does not match the predetermined column address ColX. The test mode signal generation circuitry or logic of the memory essentially ignores the first read, READ command 1105-1.

The second read command, READ command 1105-2 has associated with it bank address BAx 1107-2 and a column address ColX 1109-2. This received command, bank address, and column address match a comparison with the predetermined command, bank address, and column address stored in the memory. The matching comparison from this second read causes the memory to trigger the output of test mode signal 1140. Also, after a CAS latency 1115 after receiving READ command 1105-2, data 1125-2 from bank address BAx 1107-2 and column address ColX 1109-2 is provided out on the data lines, DQ. Sometime after receiving READ command 1105-2, test mode signal 1140 is provided. Test mode signal 1140 is generated after a time delay, TM_DELAY 1045, after receiving READ command 1105. Test mode signal 1140 has a time width, TM_WIDTH 1155. In this embodiment, test mode signal 1140 is generated as a single pulse. In an embodiment, TM-WIDTH 1055 has a duration ranging from about 2 nanoseconds to about 5 nanoseconds. In an embodiment, TM-WIDTH 1055 has a duration of about 3 nanoseconds. In an embodiment, TM-WIDTH 1055 has a duration less than about 3 nanoseconds. Test mode signal 1140 is generated after the memory receives the command and its associated bank address and column address from the system bus that has been set as a predetermined command and associated bank address and column address to be monitored by the memory. In an embodiment, test mode signal 1140 is static, that is, it is effectively not clock driven. It may be realized as an asynchronous signal that has an asynchronous delay. This allows the memory to be configured without associating clocking circuitry with the pin that outputs the test mode signal 1140 to avoid loading of this pin.

The third read command shown in FIG. 11, READ command 1105-3, has an associated bank address BAy 1107-3 and a column address ColX 1109-3. After a CAS latency 1115 after receiving READ command 1105-3, data 1125-3 from bank address BAy 1107-3 and column address ColX 1109-3 is provided out on the data lines, DQ. However, a test mode signal is not generated on detecting READ command 1105-3, since its associated bank address is BAy, which does not match the predetermined bank address BAx. The test mode signal generation circuitry or logic of the memory essentially ignores the third read, READ command 1105-3.

Figure 12:
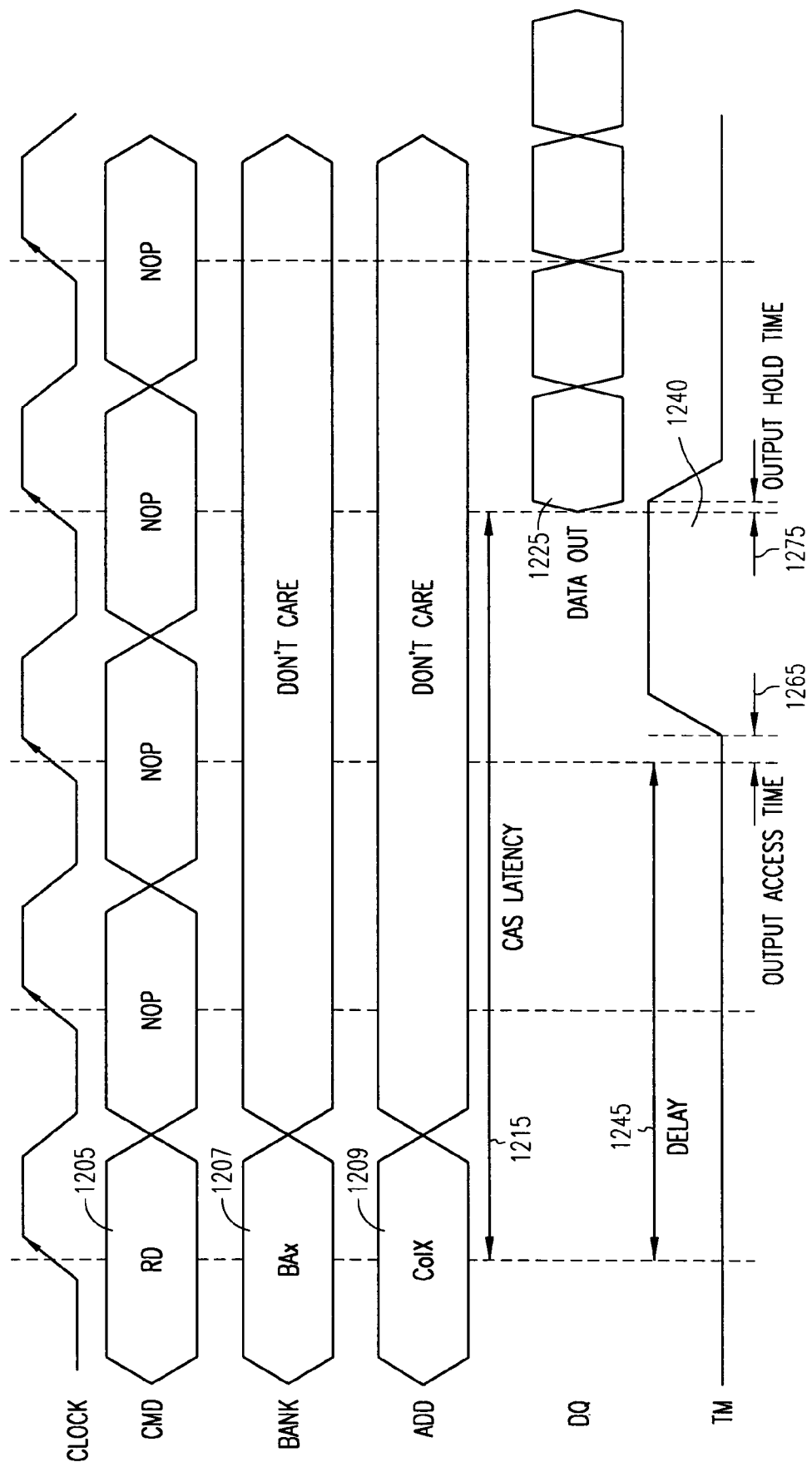
FIG. 12 illustrates an embodiment of a timing diagram for synchronous issuance of a test mode signal on detecting the presence at the memory of a predetermined command, according to the teachings of the present invention.

FIG. 12 illustrates an embodiment of a timing diagram for synchronous issuance of a test mode signal 1240 on detecting the presence at the memory of a predetermined command. In this embodiment, a mode register of the memory is configured to enable comparison of commands received by the memory with read commands to generate test mode signal 1240. The comparison process includes a comparison of the bank address 1207 and column address 1209 received with READ command 1205. The mode registers may be set with data to direct the memory to generate test mode signal 1240 on detecting READ command 1205 only if its associated bank address 1207 and/or column address 1209 have been pre-identified in the memory. The identification of the predetermined bank address and/or column address may be contained in mode registers of the memory. Alternately, the predetermined bank address and/or column address may be contained in other bit locations in the memory.

As shown in FIG. 12, after a CAS latency 1215, data 1225 is provided out on the data lines, DQ. Data 1225 may be provided as actual data that is normally transmitted in response to receiving a read command with its associated bank address and column address. Test mode signal 1240 may be output while the memory is operating normally, that is, in an embodiment, test signal 1240 doesn't affect any of the normal operation of the memory.

Sometime after READ command 1205, test mode signal 1240 is provided. Test mode signal 1240 is generated after a time delay, DELAY 1245, after receiving READ command 1205. Test mode signal 1240 has a time width 1255. In this embodiment, test mode signal 1240 is generated as a single pulse. In an embodiment, test mode signal 1240 is provided in a synchronous manner. After a delay of x cycles, test mode signal 1240 is generated and has a pulse width of y cycles. In the embodiment of FIG. 12, CAS latency 1215 is three clock cycles, delay 1245 is two clock cycles, and the width 1255 is one clock cycle. The clock periods for latency 1215, delay 1245, and the width 1255 are not limited to the above exemplary embodiment. Associated with test mode signal 1240 may be an output access time 1265 and an output hold time 1275. Output access time 1265 and output hold time 1275 may be similar to output access times and output hold times of a synchronous dynamic random access memory, SDRAM, as can be understood by those skilled in the art. In an embodiment, if a test mode signal 1240 is generated, it is generated during the CAS latency 1215 of its associated triggering READ command 1215. Test mode signal 1240 is generated after the memory receives the command and its associated bank address and column address from the system bus that has been set as a predetermined command and associated bank address and column address to be monitored by the memory.

The embodiments of FIGS. 9-12 illustrated the timing for a memory detecting a READ command as a predetermined command to monitor. Various other embodiments use other commands in a similar fashion. Examples of such other commands are shown in table 730 of FIG. 7. In an embodiment, the timing diagrams of FIGS. 9-12 are associated with a DRAM. Similar timing functionality may be provided for other types of memory that generate a test mode signal to provide output from the memory to trigger a test in response to the memory detecting a predetermined command from a system bus.

The programming of bit locations in a memory to provide a compare function of the information programmed in the bit locations with information received by the memory from various system buses has various uses. The compare function provides verification that a command and/or address from a controller is seen at the memory. This allows verification of interconnects from a controller to a command or address register to the memory. A server may be configured such that the command address propagates from the processor across the command address bus to a register on a module. The register re-drives the data to the memory, which allows using multiple modules without loading the command address bus as heavily. The compare function also allows verification of interconnects from a controller to a hub to the memory. A hub brings data and command address and other signals onto the register of the module. The hub will provide for enhanced flexibility in system memory capacity. The uses of various embodiments should allow for the testing or debugging associated with signals such as data and/or commands being transmitted incorrectly to the memory, providing a system debug feature.

The compare function associated with the embodiments for providing a memory with means to trigger test mode signal also allows a straight forward mechanism to count how many times a memory executes a specific command. For a DRAM, how many times a memory executes a specific command includes how many ACTIVATEs a DRAM executes in a given time period. Typically, users of memories such as DRAMs want to know how much power the DRAM is utilizing. If it can be determined as to how often each command is transmitted to the DRAM, the power that the DRAM consumes may be accurately estimated. In embodiments of a test mode, a counter may be used to count how many pulses occur on the pin outputting the test mode signal. The DRAM may be operated to look for a number of ACTIVATEs, a number of READs, and a number of REFRESHes by appropriating changing the predetermined command to be monitored during a given sequence of these commands. For each command set as a predetermined command, each command may be stepped through with the counter keeping track of number of times the DRAM receives each command. With these numbers collected for each command, an accurate prediction of how much power the DRAM is utilizing may be obtained. In an embodiment, a memory contains a number of sets of bit locations and logic circuitry to allow for the monitoring of multiple commands that are specified in the sets of bit locations. The logic circuitry may be programmed to determine the sequence for triggering output of test mode signals for each of the multiple commands.

The compare function associated with the embodiments for providing a memory with means to trigger test mode signal also allows a straight forward mechanism to connect test and/or measurement equipment to trigger off a known condition. The known condition may be realized by the match provided with comparing a previously known and stored command in the memory with a received command. The connection to the test and/or measurement equipment may be provided by a unique test pin or by coupling to a calibration pin of the memory.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A method comprising:
   receiving, at a memory device, information identifying a command for the memory device to monitor;
   loading the information into a register of the memory device;
   setting an indicator in a storage location in the memory device to enable or disable, in the memory device, issuing a test mode signal to provide output from the memory device to an external device that is external to the memory device, the output to trigger a test of the memory device using the external device in response to the memory device detecting the command from a system bus based on the information stored in the register.

2. The method of claim 1, wherein setting an indicator to enable or disable issuing a test mode signal to provide output from the memory device includes setting the indicator to enable issuing the test mode signal as the output from the memory device.

3. The method of claim 1, wherein setting an indicator includes setting the indicator in the register into which the information command is loaded.

4. The method of claim 1, wherein loading the information into a register of the memory device includes loading the information into a mode register of the memory device.

5. The method of claim 1, wherein the method further includes loading an address into a second register of the memory device, the address correlated to the information.

6. The method of claim 5, wherein setting an indicator includes setting the indicator in the register into which the information is loaded and in the second register.

7. The method of claim 1, wherein loading an address into a second register of the memory device includes loading the address into a mode register of the memory device.

8. The method of claim 1, wherein setting an indicator in the memory device includes storing the indicator at a bit location within a control logic of the memory device.

9. A method comprising:
   monitoring a system bus by a memory device;
   generating a test mode signal by the memory device to provide output from the memory device in response, based on information loaded and stored in the memory device, to detecting a predetermined command on the system bus, the output to trigger a test of the memory device; and
   providing the output to an external device that is external to the memory device, the output to trigger the test using the external device.

10. The method of claim 9, wherein the method further includes providing the test mode signal as the output from the memory device.

11. The method of claim 9, wherein the method further includes generating the test mode signal in response to detecting the predetermined command on the system bus when an indicator in a register of the memory device is set to enable generating the test mode signal.

12. The method of claim 9, wherein generating a test mode signal includes outputting the test mode signal as a single test mode pulse.

13. The method of claim 9, wherein generating a test mode signal includes outputting the test mode signal having a pulse width ranging from about 2 nanoseconds to about 5 nanoseconds.

14. The method of claim 9, wherein generating a test mode signal includes outputting the test mode signal at a calibration pin of the memory device.

15. The method of claim 14, wherein the method includes disabling calibration before outputting the test mode signal at the calibration pin of the memory device.

16. The method of claim 9, wherein generating a test mode signal includes outputting the test mode signal at a test mode pin of the memory device.

17. A method comprising:
arranging a set of bits to send to a memory device to load and store into a register of the memory device, wherein the arranged set of bits includes data to issue a test mode signal to provide output from the memory device to an external device that is external to the memory device, the output to trigger a test of the memory device using the external device in response to the memory device detecting a predetermined command from a system bus based on the set of bits; and
outputting the arranged set of bits directed to the memory device.

18. The method of claim 17, wherein outputting the arranged set of bits includes outputting the arranged set of bits having data to provide an indication to enable or disable the issuing of the test mode signal from the memory device.

19. The method of claim 17, wherein outputting the arranged set of bits includes outputting the arranged set of bits having data to identify the predetermined command.

20. The method of claim 17, wherein arranging a set of bits includes formatting the bits to be loaded into a mode register of the memory device.

21. The method of claim 17, wherein arranging a set of bits includes formatting the bits to be loaded into a mode register of the memory device to identify a method to provide output from the memory device.

22. The method of claim 17, wherein arranging a set of bits and outputting the set of bits includes formatting the set of bits into an address and sending the address onto an address bus to the memory device.

23. A memory device comprising:
a number of bit locations assigned to store information to generate a test mode signal from the memory device to an external device that is external to the memory device to trigger a test of the memory device using the external device in response to the memory device detecting a predetermined command from a system bus based on the information;
control logic to manage generation of the test mode signal based on the information; and
a port to output the test mode signal from the memory device to trigger the test using the external device.

24. The memory device of claim 23, wherein the number of bit locations are arranged to store information identifying the predetermined command.

25. The memory device of claim 23, wherein the number of bit locations are arranged to store an indication to enable or disable generating a test mode signal from the memory device to trigger a test.

26. The memory device of claim 23, wherein the port includes a calibration pin at which the test mode signal is output.

27. The memory device of claim 23, wherein the port includes a test mode pin at which the test mode signal is output.

28. The memory device of claim 23, wherein the memory device is configured to output the test mode signal as a single test mode pulse.

29. The memory device of claim 23, wherein the memory device is configured to output the test mode signal having a pulse width of less than about 3 nanoseconds.

30. The memory device of claim 23, where the number of bit locations is included in a mode register.

31. The memory device of claim 23, where a number of bit locations assigned to store information to generate a test mode signal are included in two or more mode registers.

32. The memory device of claim 23, wherein the memory device is configured in an integrated circuit.

33. The memory device of claim 23, wherein the memory device is a dynamic random access memory.

34. A system comprising:
a controller;
a system bus coupled to the controller; and
a memory device coupled to the system bus, the memory device including a number of bit locations assigned to store information to issue a test mode signal from the memory device to an external device that is external to the memory device to trigger a test of the memory device using the external device in response to detecting a predetermined command from the system bus based on the information, the memory device including a port to output the test mode signal from the memory device to trigger the test using the external device.

35. The system of claim 34, wherein the number of bit locations are arranged to store information identifying the predetermined command.

36. The system of claim 34, wherein the number of bit locations are arranged to store an indication to enable or disable issuing the test mode signal from the memory device to trigger a test.

37. The system of claim 34, where a number of bit locations assigned to store information to issue a test mode signal are included in a number of mode registers.

38. The system of claim 34, wherein the controller is a processor.

39. The system of claim 34, wherein the memory device is a dynamic random access memory.

40. A method of forming a memory device comprising:
forming a number of inputs in the memory device to receive a command from a system bus;
forming a number of bit locations in the memory device to store information identifying a predetermined command for which the memory device monitors the system bus to generate a test mode signal;
forming control logic to generate a test mode signal from the memory device to trigger a test of the memory device in response to detecting the predetermined command from the system bus based on the information; and
forming a port to output the test mode signal from the memory device to an external device that is external to the memory device to trigger the test using the external device.

41. The method of claim 40, wherein the method includes forming the number of bit locations as a portion of a register in the memory device.

42. The method of claim 40, wherein the method includes forming a number of mode registers in the memory device that include the number of bit locations.

43. The method of claim 40, wherein forming the number of bit locations includes forming the number of bit locations configured in the memory device to receive an indicator to enable or disable the memory device issuing the test mode signal.

44. The method of claim 40, wherein forming the number of bit locations includes forming the number of bit locations configured in the memory device to receive an address correlated to the predetermined command.

45. The method of claim 40, wherein forming a port to output the test mode signal includes forming a test mode pin to output the test mode signal.

46. The method of claim 40, wherein forming a port to output the test mode signal includes configuring circuitry operable to output the test mode signal on a calibration pin.

47. The method of claim 46, wherein the method includes configuring the circuitry to disable calibration in the memory device to output the test mode signal on the calibration pin.

48. A method of forming a system comprising:

providing a controller;

coupling a system bus to the controller; and coupling a memory device to the system bus, wherein the memory device includes a number of bit locations to store information identifying a predetermined command for which the memory device operatively monitors the system bus to issue a test mode signal from the memory device to an external device that is external to the memory device to trigger a test of the memory device using the external device in response to detecting the command from the system bus based on the information, and the memory device includes a port to output the test mode signal from the memory device to trigger the test using the external device.

49. The method of claim 48, wherein coupling a memory device to the system bus includes coupling a memory device having a number of mode registers that include the number of bit locations.

50. The method of claim 48, wherein coupling a memory device to the system bus includes coupling a memory device having the number of bit locations configured to receive an indicator to enable or disable the memory device issuing the test mode signal.

51. The method of claim 48, wherein providing a controller includes providing a processor as the controller.

52. A computer-readable medium having computer-executable instructions for performing a method comprising:

arranging a set of bits to send to a memory device to load into a register of the memory device, wherein the arranged set of bits includes data to issue a test mode signal to provide output from the memory device to an external device that is external to the memory device in response to the memory device detecting a predetermined command from a system bus based on the set of bits, the output to trigger a test of the memory device using the external device; and outputting the arranged set of bits directed to the memory device.

53. The computer-readable medium of claim 52, wherein outputting the arranged set of bits includes outputting the arranged set of bits having data to provide an indication to enable or disable the issuing of the test mode signal from the memory device.

54. The computer-readable medium of claim 52, wherein outputting the arranged set of bits includes outputting the arrange set of bits having data to identify the predetermined command.

55. The computer-readable medium of claim 52, wherein arranging a set of bits includes formatting the bits to be loaded into mode register of the memory device.

56. The computer-readable medium of claim 52, wherein arranging a set of bits and outputting the set of bits includes formatting the set of bits into an address and transmitting the address onto an address bus to memory device.

57. A computer-readable medium having computer-executable instruction to performed operation comprising:

manipulating data for issuing a test mode signal from a memory device to trigger a test of the memory device, the data correlated to a data structure stored a computer-readable medium, the data structure including one or more fields containing data representing information to issue the test mode signal, in response to the memory device detecting a predetermined command from system bus base on the information, from memory device to an external device that is external to the memory device to trigger the test using the external device.

58. The computer-readable medium of claim 57, wherein the one or more field containing data include data representing an indication to enable or disable issuing the test mode signal from the memory device.

59. The computer-readable medium of claim 57, wherein the one or more field containing data include data representing information identifying the predetermined command.

60. The computer-readable medium of claim 57, wherein the data structure includes a plurality of fields containing data representing information to issue a test mode signal data format as an address to propagate on an address bus.

61. The computer-readable medium of claim 57, wherein the data structure includes:

a first field containing data representing an indication to enable or disable issuing the test mode signal from memory device; and a second field containing data representing information identifying the predetermined command.

62. An apparatus comprising:

a device to provide or receive a set of electrical signals such that the set of electrical signals provide a data signal having data representing information to store in a register of a memory device to issue a test mode signal to provide output from the memory device to an external device that is external to the memory device, the output to trigger a test of the memory device using the external device in response to the memory device detecting a predetermined command from a system bus based on the information.

63. The apparatus of claim 60, wherein the data includes a data portion to enable or disable issuing the test mode signal.

64. The apparatus of claim 60, wherein the data includes a data portion to identifying the predetermined command.

65. The apparatus of claim 60, wherein the data includes a data portion having an address associated with the predetermined command.

* * * * *

UNITED STATES PATENT AND TRADEMARK OFFICE
CERTIFICATE OF CORRECTION

| | | |
|---|---|---|
| PATENT NO. | : 7,519,877 B2 | Page 1 of 2 |
| APPLICATION NO. | : 10/915663 | |
| DATED | : April 14, 2009 | |
| INVENTOR(S) | : Janzen | |

It is certified that error appears in the above-identified patent and that said Letters Patent is hereby corrected as shown below:

In column 19, line 55, in Claim 54, delete "arrange" and insert -- arranged --, therefor.

In column 20, line 3, in Claim 55, delete "into" and insert -- into a --, therefor.

In column 20, line 7, in Claim 56, delete "to memory" and insert -- to the memory --, therefor.

In column 20, line 9, in Claim 57, delete "instruction" and insert -- instructions --, therefor.

In column 20, line 9, in Claim 57, delete "performed operation" and insert -- perform operations --, therefor.

In column 20, line 12, in Claim 57, delete "stored a" and insert -- stored on the --, therefor.

In column 20, line 16, in Claim 57, delete "from" and insert -- from a --, therefor.

In column 20, line 17, in Claim 57, delete "base" and insert -- based --, therefor.

In column 20, line 17, in Claim 57, delete "from" and insert -- from the --, therefor.

In column 20, line 21, in Claim 58, delete "field" and insert -- fields --, therefor.

In column 20, line 25, in Claim 59, delete "field" and insert -- fields --, therefor.

In column 20, line 30, in Claim 60, delete "format" and insert -- formatted --, therefor.

UNITED STATES PATENT AND TRADEMARK OFFICE
CERTIFICATE OF CORRECTION

PATENT NO. : 7,519,877 B2
APPLICATION NO. : 10/915663
DATED : April 14, 2009
INVENTOR(S) : Janzen It is certified that error appears in the above-identified patent and that said Letters Patent is hereby corrected as shown below:

In column 20, line 34, in Claim 61, delete "from" and insert -- from the --, therefor.

In column 20, line 52, in Claim 64, delete "identifying" and insert -- identify --, therefor.

Signed and Sealed this

Fourteenth Day of July, 2009

JOHN DOLL
*Acting Director of the United States Patent and Trademark Office*